United States Patent [19]
Loris

[11] Patent Number: 4,878,153
[45] Date of Patent: Oct. 31, 1989

[54] ELECTRONIC SHELF ASSEMBLY

[75] Inventor: William P. Loris, Bloomingdale, Ill.

[73] Assignee: Rockwell International Corporation, El Segundo, Calif.

[21] Appl. No.: 197,373

[22] Filed: May 23, 1988

[51] Int. Cl.[4] .............................................. H05K 5/02
[52] U.S. Cl. ................................... 361/394; 361/389; 361/399; 361/415
[58] Field of Search ................. 361/389, 394, 399, 415

[56] References Cited

U.S. PATENT DOCUMENTS

| | | | |
|---|---|---|---|
| 3,574,204 | 12/1970 | Sosinski | 361/394 X |
| 3,899,721 | 8/1975 | Borchard | 211/41 X |
| 3,932,016 | 1/1976 | Ammenheuser | 361/415 X |
| 4,520,428 | 5/1985 | Lusk | 361/399 |
| 4,664,265 | 5/1987 | George | 211/41 |
| 4,688,149 | 8/1987 | Inoue et al. | 361/399 |

OTHER PUBLICATIONS

D. E. Rutter, Sr., AIR BAG, IBM Tech. Disc. Bull., vol. 11, #12, May 1969, p. 1694.

Primary Examiner—R. R. Kucia
Attorney, Agent, or Firm—C. B. Patti; V. L. Sewell; H. F. Hamann

[57] ABSTRACT

An electronic shelf assembly for holding a plurality of electronic modules. The shelf assembly has a first substantially flat, flexible, preformed plastic plate having a plurality of parallel guide channels defined by opposed parallel ribs projecting out of the plane of the first plate. The plate has a predetermined convex contour perpendicular to the guide channels. Small raised extensions in substantially the center of each of the guide channels project out of the plane of the first plate for engaging a recess in at least a first edge of the module, when the module is fully inserted in one of the guide channels. A second substantially flat, flexible, preformed plastic plate has a plurality of parallel guide channels defined by opposed parallel ribs projecting out of the plane of the second plate. The guide channels of the second plate are longitudinally aligned with respective ones of the guide channels of the first plate.

4 Claims, 2 Drawing Sheets

ELECTRONIC SHELF ASSEMBLY

BACKGROUND OF THE INVENTION

This invention relates in general to a shelf assembly for supporting electronic modules, printed circuit boards and the like and, in particular, to a shelf assembly in which vibrations are minimized between an inserted electronic module and the shelf assembly.

In the assembly of various types of electronic apparatus, such as communication transmission equipment, a plurality of electronic modules are plugged into connector plugs of a back plane assembly for interconnection of the modules to other electronic apparatus. In order to facilitate the insertion of the modules into the connector plugs, shelves are provided for supporting the modules and for aligning the modules with the connector plugs. Typically a plurality of shelves are horizontally mounted on a vertical frame in a spaced relationship from each other and include guide tracks or channels formed on upper and lower surfaces of the shelves. The upper guide tracks of one shelf cooperate with the lower guide tracks of an adjacent shelf to slidably receive lower and upper edges of the module. In this manner, the support shelf provides support for the modules, proper alignment of the modules relative to the connector plugs of the back plane assembly, and orderly connection of the modules to the connector plugs.

Due to dimensional tolerances of the electronic modules, the guide channels, the connectors, and structural members of the shelf assembly, the dimensions of a complete shelf assembly must be such that a module fits relatively loosely therein to guarantee easy insertion and removal of the modules. As a result of the loose fit of a module in a shelf assembly, the electrical contacts on an edge of a module do not always make sufficient contact with the mating connector, especially if the shelf assembly is subjected to vibration. Shelf assemblies which are subjected to vibration from the environment thus risk the possibility of intermittent electrical connections between the modules and the connectors, resulting in poor and undesirable operation of the electronic equipment.

The present invention overcomes this drawback in the prior art.

SUMMARY OF THE INVENTION

The present invention is an electronic shelf assembly for holding a plurality of electronic modules. The shelf assembly has a first substantially flat, flexible, preformed plastic plate having a plurality of parallel guide channels defined by opposed parallel ribs projecting out of the plane of the first plate. The plate has a predetermined convex contour perpendicular to the guide channels. Small raised extensions in substantially the center of each of the guide channels project out of the plane of the first plate for engaging a recess in at least a first edge of the module, when the module is fully inserted in one of the guide channels. A second substantially flat, flexible, preformed plastic plate has a plurality of parallel guide channels defined by opposed parallel ribs projecting out of the plane of the second plate. The guide channels of the second plate are longitudinally aligned with respective ones of the guide channels of the first plate.

A rigid means extends between the first and second plates for interconnecting the first and second plates. First, second and third cross members are attached to each of the first and second plates. For each plate the first and second cross members are attached at a front end and a back end, and the third cross member is attached at the edges of the plate at substantially the middle of the plate and opposed from the small raised extensions. The first, second and third cross members have ends attached to the rigid means for interconnecting the first and second plates.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

The present invention has general applicability but is most advantageously utilized for a shelf assembly which is used for supporting electronic modules, printed circuit boards or the like.

Electronic shelf assemblies for supporting printed circuit boards are well known in the prior art. In general, the printed circuit boards or electronic modules are plugged into connector plugs on a back plane assembly within the electronic shelf assembly. When the electronic shelf assembly is used in environments where it is subjected to vibration, there exists the risk that the electronic module will become detached from the connector plug. The present invention ovecomes this problem in the prior art.

Figure 1:
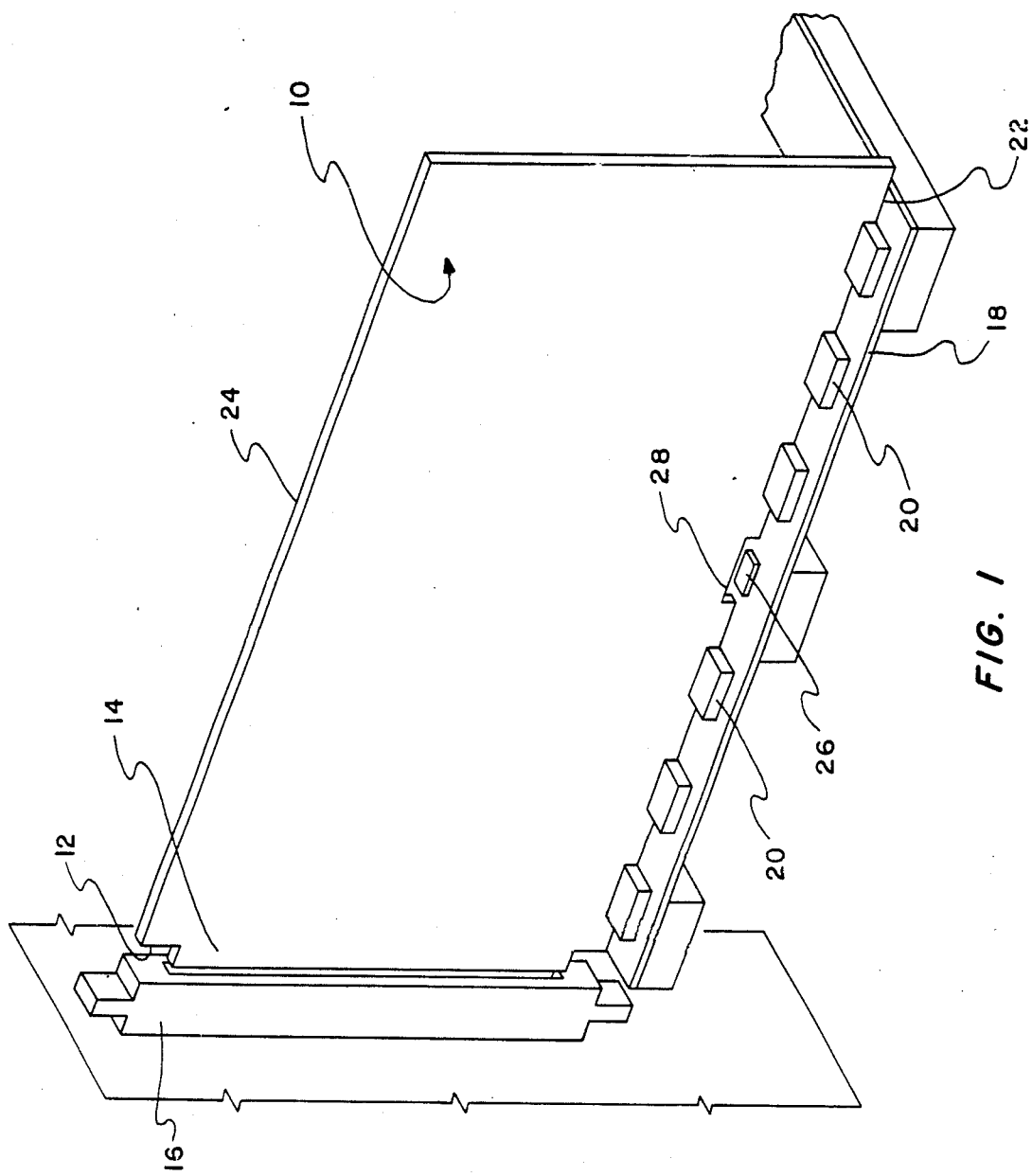
FIG. 1 is a partially cut away perspective view of an electronic module inserted in a shelf assembly of a portion of the present invention.

As showin in FIG. 1 in a partial cut away view, an electronic module 10 has a back edge 12 carrying a plurality of electrical contacts 14 which make electrical connection with internal contacts of the connector plug 16. A lower support 18 carries ribs 20 which form a guide channel as will be explained below. Not shown in FIG. 1 is a corresponding upper support which has a guide channel for a top edge 24 of the module 10. A bottom edge 22 of the module 10 is contained in the lower guide channel formed by the ribs 20.

A small raised extension 26 on the lower support 18 engages a recess 28 in the module 10. The extension 26 is located approximately in the center of the lower support 18, although the present invention would work equally well even if the small extension 26 was offset from the center location as shown in FIG. 1. At this center location, the lower support 18 has enough flexibility that as the module 10 is slid into the shelf assembly along the guide channel, the extension 26 will flex downward until the module 10 is fully inserted, at which time, the extension 26 will return to its normal position and be within the recess 28 of the module 10. Thus, the module 10 is restrained from disengaging from the connector 16 due to vibrations. Only a significant force by an operator will be able to disengage the module 10 at its recess 28 from the extension 26.

Figure 3:
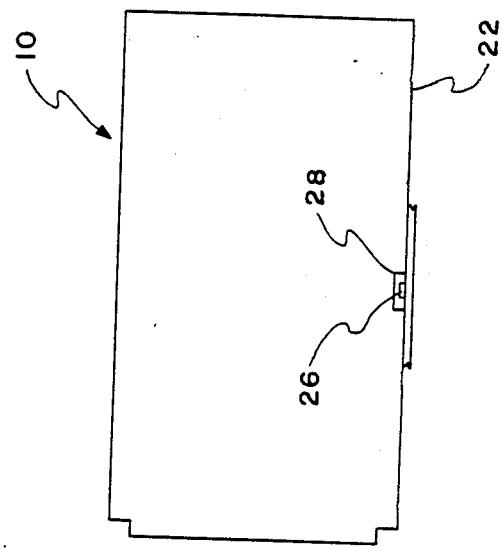
FIG. 3 is a side view of an electronic module and a portion of the shelf assembly.
Figure 4:
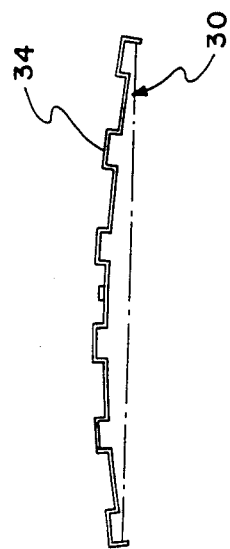
FIG. 4 is a cross sectional view of the shelf assembly.
Figure 2:
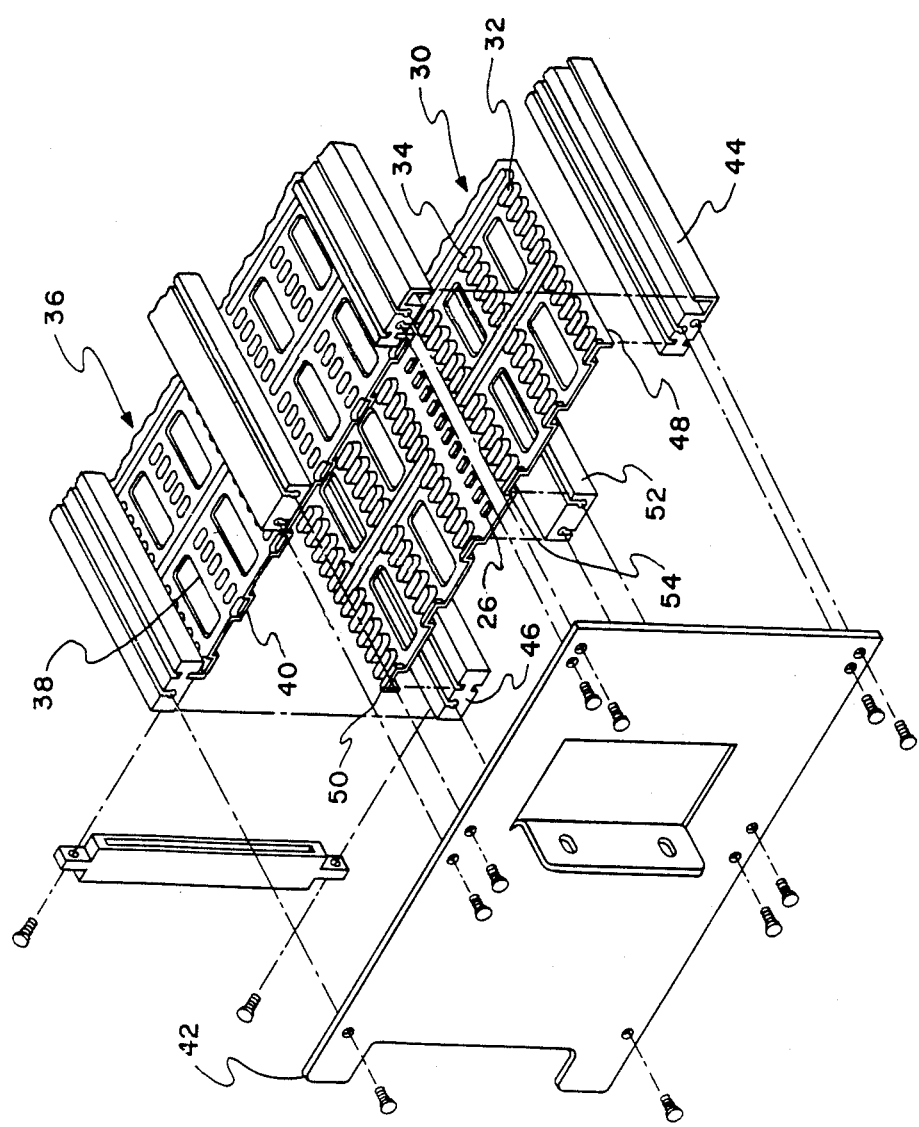
FIG. 2 is a perspective exploded view of the shelf assembly.

The shelf assembly is shown in more detail in FIGS. 2, 3 and 4. As shown in FIG. 2, a first substantially flat, flexible, preformed plastic plate 30 has a plurality of parallel guide channels 32 defined by opposed parallel ribs 34. The plate 30 has a predetermined, convex contour perpendicular to the guide channels 32, as shown in FIG. 4. Small raised extensions 34 in substantially the center of each of the guide channels 32 of the plate 30 project out of the plane of the plate 30 for engaging the recess 28 in at least the first edge 22 of the module 10 when the module 10 is fully inserted in one of the guide channels 32.

A second substantially flat, flexible, preformed plastic plate 36 has a plurality of parallel guide channels 38 defined by opposed parallel ribs 40 projecting out of the plane of the second plate 36. The guide channels 38 of the second plate 36 are longitudinally aligned with perspective ones of the guide channels 32 of the first plate 30. Rigid means 42 extends between the first and second plates 30 and 36 for interconnecting the first and second plates 30 and 36. When the modules are inserted in the guide channels 32 and 38 and slid into a predetermined position where the small raised extensions 34 engage the recesses 28 in the edges of the modules 10, the modules 10 are then held in place and vibrations are minimized between the modules 10 and the shelf assembly.

It can be appreciated that the second plate 36 can also be constructed similar to the first plate 30 and have a predetermined convex contour perpendicular to the guide channels 38. The second plate 36 may then have its own small raised extensions projecting out of the plane of the second plate 36 and located substantially in the center of each of the guide channels. These small extensions would then engage a corresponding recess in a second or top edge of the module 10 when the module 10 is fully inserted in one of the guide channels 32, 38.

Furthermore, as shown in FIG. 2, the shelf assembly may have at least first and second cross members 44 and 46 attached to a front end 48 and a back end 50, respectively, of each of the first and second plates 30 and 36. Each of the cross members 44 and 46 are also attached to the rigid means 42. Furthermore, a third cross member 52 may be attached to edge regions 54 of each of the first and second plates 30 and 36 and located substantially in the middle of the first and second plates 30 and 36. This third cross member 52 is opposed from the small raised extensions 34. The third cross member 52 is also attached to the rigid means 42.

It is in vision that the specific shape of the extensions 34 and the recess 28 may have a variety of configurations. For example, the leading and trailing edges of the extension 34 may be sloped to allow for ease of insertion and removal of the module 10 from the guide channels.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An electronic shelf assembly for holding a plurality of electronic modules, comprising:

first planar means for supporting the modules and having a plurality of means for guiding the modules along a first edge thereof, said means for guiding projecting out of the plane of said first means for supporting;

means for providing an extension in a predetermined location in at least one of said means for guiding for engaging a recess in at least a first edge of the module, when the module is fully inserted in one of said means for guiding;

second planar means having a plurality of means for guiding the module along a second edge of the module, opposed to said first edge, said means for guiding projecting out of the plane of said second means for supporting, said means for guiding of said second means for supporting being longitudinally aligned with respective ones of the means for guiding of said first means for supporting, said second means for supporting having a predetermined convex contour perpendicular to said means for guiding and means for providing an extension projecting out of the plane of said second means for supporting in a predetermined location in at least one of said means for guiding for engaging a recess in said second edge of the module, when the modules are fully inserted in one of said means for guiding; and rigid means extending between said first and second means for supporting for interconnecting said first and second means for supporting.

2. An electronic shelf assembly for holding a plurality of electronic modules, comprising:

first substantially flat, flexible, preformed plastic plate having a plurality of parallel guide channels defined by opposed parallel ribs projecting out of the plane of said first plate, said first plate having a predetermined convex contour perpendicular to said guide channels;

small raised extensions in substantially the center of each of said guide channels of said first plate projecting out of the plane of said first plate for engaging a recess in at least a first edge of the modules, when the modules are fully inserted in one of said guide channels:

second substantially flat, flexible, preformed plastic plate having a plurality of parallel guide channels defined by opposed parallel ribs projecting out of the plane of said second plate and the guide channels of said second plate being longitudinally aligned with respective ones of the guide channels of said first plate, said second plate having a predetermined convex contour perpendicular to said guide channels and small raised extensions in substantially the center of each of said guide channels projecting out of the plane of said second plate for engaging a recess in a second edge of the modules when the modules are fully inserted in one of said guide channels; and rigid means extending between said first and second plates for interconnecting said first and second plates;

wherein said modules are inserted in said guide channels of said first and second plates and slid into a predetermined position where said small raised extensions engage said recesses in edges of the modules thereby minimizing vibrations between said modules and said shelf assembly.

3. The electronic shelf assembly according to claim 2, wherein said shelf assembly further comprises at least first and second cross members attached to a front end and a back end, respectively, of each of said first and second plates, each of said cross members also attached to said rigid means for interconnecting.

4. The electronic shelf assembly according to claim 3, wherein said shelf assembly further comprises third cross members attached to edge regions of each of said first and second plates and located substantially in the middle of said first and second plates and opposed from said small raised extensions; said third cross member also attached to said rigid means for interconnecting.

* * * * *